(12) United States Patent
Won

(10) Patent No.: US 8,357,948 B2
(45) Date of Patent: Jan. 22, 2013

(54) LIGHT EMITTING DEVICE AND LIGHTING SYSTEM

(75) Inventor: Jung Min Won, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 130 days.

(21) Appl. No.: 12/951,507

(22) Filed: Nov. 22, 2010

(65) Prior Publication Data

US 2011/0163338 A1  Jul. 7, 2011

(30) Foreign Application Priority Data

Jan. 5, 2010  (KR) .................. 10-2010-0000487

(51) Int. Cl.
*H01L 33/00* (2010.01)
(52) U.S. Cl. .................. 257/98; 257/E33.056
(58) Field of Classification Search .............. 257/98, 257/E33.056, E33.067, E33.072
See application file for complete search history.

(56) References Cited

U.S. PATENT DOCUMENTS

| | | |
|---|---|---|
| 2005/0230692 A1 | 10/2005 | Kim et al. |
| 2006/0001055 A1 | 1/2006 | Ueno et al. |
| 2007/0200131 A1 | 8/2007 | Kim |
| 2009/0026472 A1 | 1/2009 | Yasuda et al. |
| 2010/0207152 A1* | 8/2010 | Won ................... 257/98 |
| 2010/0224903 A1 | 9/2010 | Cho et al. |
| 2011/0149601 A1* | 6/2011 | Jang ................. 362/612 |
| 2011/0175122 A1* | 7/2011 | Kim ................... 257/98 |

FOREIGN PATENT DOCUMENTS

KR  10-0631521 A  9/2006

* cited by examiner

*Primary Examiner* — Phuc Dang
(74) *Attorney, Agent, or Firm* — Birch, Stewart, Kolasch & Birch, LLP

(57) ABSTRACT

Disclosed are a light emitting device and a method of manufacturing the same. The light emitting device includes a body, an insulating layer over a surface of the body, at least one electrode over the insulating layer, a light emitting diode connected to the electrode, and a reflective layer over the insulating layer.

19 Claims, 11 Drawing Sheets

US 8,357,948 B2

LIGHT EMITTING DEVICE AND LIGHTING SYSTEM

CROSS-REFERENCE TO RELATED APPLICATIONS

The present application claims priority under 35 U.S.C. 119 and 35 U.S.C. 365 to Korean Patent Application No. 10-2010-0000487(filed on Jan. 5, 2010), which is hereby incorporated by reference in its entirety.

BACKGROUND

The embodiment relates to a light emitting device and a method of manufacturing the light emitting device.

A light emitting diode (LED) is a semiconductor light emitting device that converts current into light. The LED can generate light having high brightness, so that the LED has been expensively used as a light source for a display device, a vehicle, or a lighting device. In addition, the LED can represent a white color having superior light efficiency by employing phosphors or combining LEDs having various colors.

In order to improve the brightness and the performance of the LED, various attempts have been performed to improve a light extracting structure, an active layer structure, current spreading, an electrode structure, and a structure of a light emitting diode package.

SUMMARY

The embodiment provides a light emitting device having a novel structure and a method of manufacturing the same.

The embodiment provides a light emitting device capable of improving light emission efficiency.

According to the embodiment, the light emitting device includes a body, an insulating layer over a surface of the body, at least one electrode over the insulating layer, a light emitting diode connected to the electrode, and a reflective layer over the insulating layer.

According to the embodiment, the method of manufacturing the light emitting device includes forming an insulating layer over a surface of the body, forming at least one electrode over the insulating layer, forming a reflective layer over the insulating layer and the electrode, and forming a light emitting diode over the body.

DETAILED DESCRIPTION OF THE EMBODIMENTS

Figure 1:
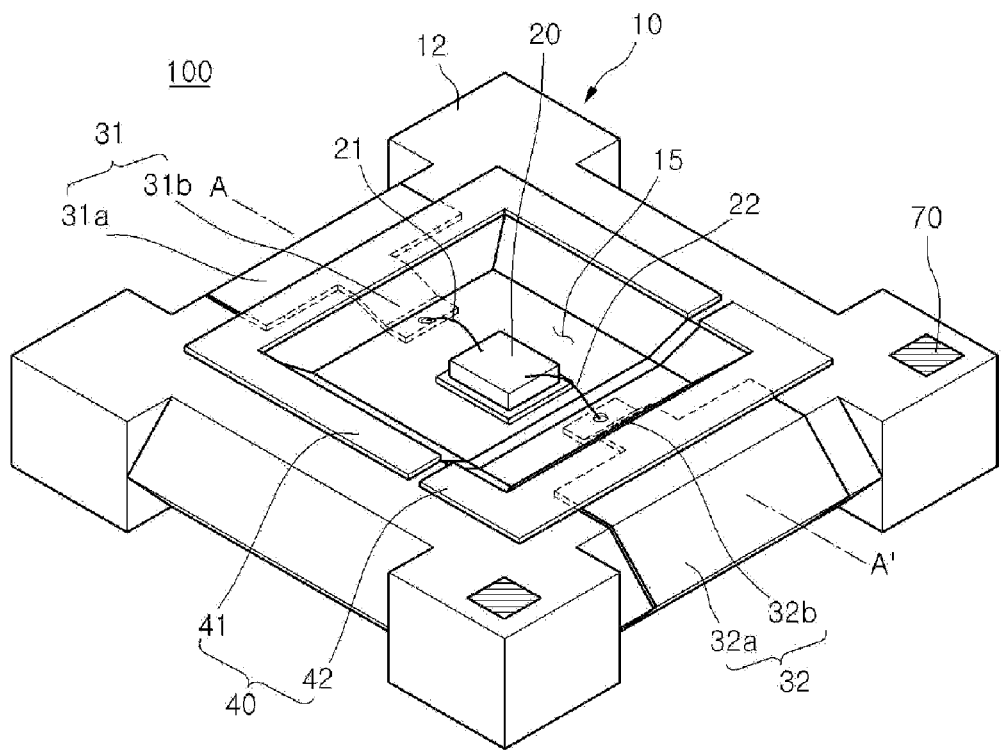
FIG. 1 is a perspective view showing a light emitting device according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, the light emitting device according to embodiments and a method of manufacturing the same will be described with reference to accompanying drawings.

Embodiment 1

Figure 2:
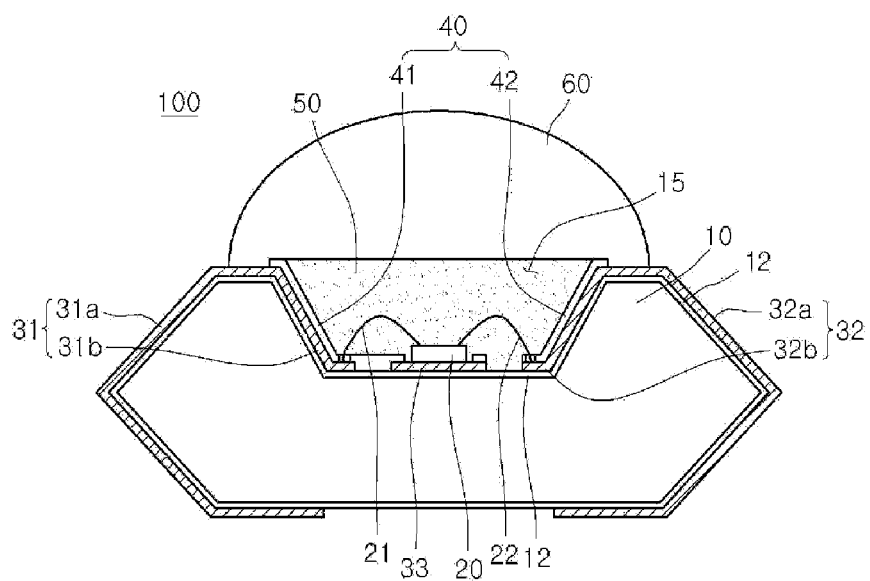
FIG. 2 is a sectional view taken along line A-A' of FIG. 1.
Figure 3:
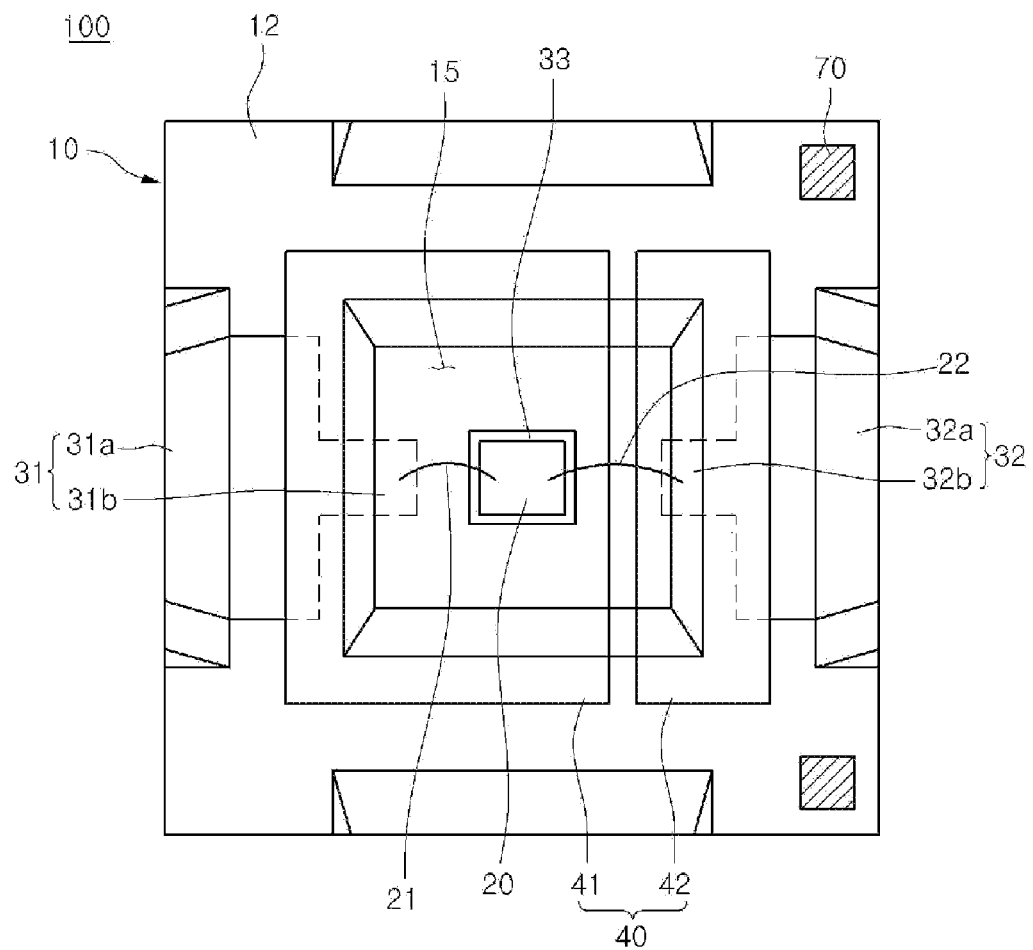
FIG. 3 is a top view showing the light emitting device according to the first embodiment.

FIG. 1 is a perspective view showing a light emitting device 100 according to a first embodiment, and FIG. 2 is a sectional view taken along line A-A' of FIG. 1. FIG. 3 is a top view showing the light emitting device 100.

Referring to FIGS. 1 and 3, the light emitting device 100 includes a body 10, an insulating layer 12 formed over the surface of the body 10 and including silicon oxide ($Si_xO_y$), at least one light emitting diode 20 provided over the body 10, first and second electrodes 31 and 32 provided over the body 10 and electrically connected to the light emitting diode 20, and a reflective layer 40, at least a part of which makes contact with the top surface of the insulating layer 12 to reflect light emitted from the light emitting diode 20.

In addition, as shown in FIG. 2, the light emitting device 100 may further include an encapsulant 50 to seal the light emitting diode 20 and a lens 60 formed over the encapsulant 50, but the embodiment is not limited thereto.

The reflectance of the reflective layer 40 may vary according to the type of materials of a layer in the contact with a lower portion of the reflective layer 40. In detail, the variation in the reflectance of the reflective layer 40 is caused by the difference in the refractive indexes between the two layers or the surface shape of the layer in the contact with the lower portion of the reflective layer 40.

For example, if the reflective layer 40 includes a Ti/Ag layer in which Ti and Ag are sequentially stacked, the insulating layer 12 includes $SiO_2$, and the first and second electrodes 31 and 32 includes a Ti/Cu/Ni/Au layer in which Ti, Cu, Ni, Au are sequentially stacked, when the first and second electrodes 31 and 32 make contact with the lower portion of the reflective layer 40, the reflective layer 40 represents a lower reflectance as compared with when the insulating layer 12 makes contact with the lower portion of the reflective layer 40. In other words, when $SiO_2$ makes contact with the lower portion of the reflective layer 40, the reflective layer 40 represent a higher reflectance as compared with when Au makes contact with the lower portion of the reflective layer 40.

Therefore, according to the embodiment, the contact area between the reflective layer 40 and the first and second electrodes 31 and 32 is reduced, and the contact area between the reflective layer 40 and the insulating layer 12 is increased, thereby improving the reflectance of the reflective layer 40, and improving the light emission efficiency of the light emitting device 100.

Hereinafter, the components and the operation of the light emitting device 100 will be described in detail.

The body 10 may include Si, Al, AlN, $AlO_x$, PSG (photo sensitive glass), $Al_2O_3$, BeO, a PCB (Printed Circuit Board), or various resins, but the embodiment is not limited thereto.

For example, the body 10 may be formed through injection-molding, or may include a stack structure of a plurality of layers.

If the body 10 includes Si, a protective device such as a zener diode may be integrated into the body 10 by injecting conductive dopants, but the embodiment is not limited thereto.

The body 10 may include a cavity 15 such that an upper portion of the body 10 is open. For example, the cavity 15 may be formed through injection-molding or etching.

The cavity 15 may have the shape of a cup or a concave vessel. The cavity 15 may have an internal lateral surface perpendicular to the body 10 or a lateral surface inclined with respect to the body 10. If the inclined surface is formed by performing a wet etching process with respect to the body 10 including Si, the inclined lateral surface may have an inclined angle of 50° to 60°.

The surface of the cavity 15 may have a circular shape, a rectangular shape, a polygonal shape, or an oval shape.

The insulating layer 12 may be formed over the surface of the body 10.

The insulating layer 12 prevents the body 10 from being electrically shorted with the first and second electrodes 31 and 32 or an external power source. Accordingly, if the body 10 includes an insulator such as AlN, or $AlO_x$, the insulating layer 12 may not be formed.

For example, the insulating layer 12 may include at least one selected from the group consisting of $SiO_2$, $Si_xO_y$, $Si_3N_4$, $Si_xN_y$, $SiO_xN_y$, and $Al_2O_3$. Preferably, the insulating layer 12 may include $SiO_2$ or $Si_xO_y$, but the embodiment is not limited thereto.

If the body 10 includes Si, the insulating layer 12 may have the form of a silicon oxide film through a thermal oxidation scheme. In addition, the insulating layer 12 may be formed through sputtering, PECVD (Plasma Enhanced Chemical Vapor Deposition), or E-beam deposition, but the embodiment is not limited thereto.

The insulating layer 12 may be formed at the whole region of the surface of the body 10 or may be formed at the regions of the first and second electrodes 31 and 32 and the reflective layer 40, but the embodiment is not limited thereto.

The insulating layer 12 may be provided thereon with the first electrode 31 and the second electrode 32. The first electrode 31 and the second electrode 32 electrically act as a cathode and an anode, respectively, so that power can be supplied to the light emitting diode 20. Meanwhile, a plurality of electrodes may be formed other than the first and second electrodes 31 and 32 according to the design of the light emitting device 100, but the embodiment is not limited thereto.

The first and second electrodes 31 and 32 may have a multi-layer structure. For example, the first and second electrodes 31 and 32 may include a Ti/Cu/Ni/Au layer in which Ti, Cu, Ni, and Au are sequentially stacked.

A material such as Ti, Cr, or Ta representing superior adhesion strength with respect to the insulating layer 12 is stacked over the lowermost layer of the first and second electrodes 31 and 32. A material such as Au is stacked over the uppermost layer of the first and second electrodes 31 and 32 so that a wire can be easily attached to the uppermost layer. In addition, a diffusion barrier layer including Pt, Ni, or Cu may be stacked between the uppermost layer and the lowermost layer of the first and second electrodes 31 and 32, but the embodiment is not limited thereto.

The first and second electrodes 31 and 32 may be selectively formed through a plating scheme, a deposition scheme, or a photolithography scheme, but the embodiment is not limited thereto.

Meanwhile, as shown in FIGS. 1 and 3, in order to clearly distinguish between the first and second electrodes 31 and 32, a cathode mark 70 may be formed over the body 10, but the embodiment is not limited thereto.

The reflective layer 40 may be formed over the insulating layer 12 over the top surface of the body 10, the first electrode 31, and the second electrode 32. The reflective layer 40 may be formed at a position in which light emitted from the light emitting diode 20 can be effectively reflected, for example, at an inside of the cavity 15 of the body 10, but the embodiment is not limited thereto.

If the reflective layer 140 has electrical conductivity, the reflective layer 40 may be electrically isolated from the first and second reflective layers 41 and 42 such that the first and second electrodes 31 and 32 are not electrically shorted with each other. Accordingly, the first reflective layer 41 and the second reflective layer 42 act as the first and second electrodes 31 and 32, respectively.

The reflective layer 40 may have a multi-layer structure. For example, the reflective layer 40 may include a Ti/Ag layer in which Ti and Ag are sequentially stacked.

In other words, the lower layer of the reflective layer 40 includes at least one of Ti, Cr, and Ta representing superior adhesion strength with respect to the insulating layer 12 or the first and second electrodes 31 and 32, and the upper layer of the reflective layer 40 may include at least one of Al, Ag, and Pd representing a high reflectance, but the embodiment is not limited thereto.

However, the reflectance of the reflective layer 40 may vary according to materials constituting a layer making contact with the lower portion of the reflective layer 40. In detail, the variation in the reflectance of the reflective layer 40 is caused by the difference in the refractive indexes between the two layers or the surface shape of the layer in the contact with the lower portion of the reflective layer 40.

For example, if the reflective layer 40 includes a Ti/Ag layer in which Ti and Ag are sequentially stacked, the insulating layer 12 includes $Si_xO_y$, and the first and second electrodes 31 and 32 includes a Ti/Cu/Ni/Au layer in which Ti, Cu, Ni, Au are sequentially stacked, when the first and second electrodes 31 and 32 make contact with the lower portion of the reflective layer 40, the reflective layer 40 represents a lower reflectance as compared with when the insulating layer 12 makes contact with the lower portion of the reflective layer 40.

In detail, when Au stacked over the uppermost layers of the first and second electrodes 31 and 32 makes contact with the lower portion of the reflective layer 140, the reflective layer 40 represents a 90% or less of a reflectance. In contrast, when the insulating layer 12 including $Si_xO_y$ makes contact with the lower portion of the reflective layer 40, the reflective layer 40 approximately represents 100% of a reflectance.

Therefore, according to the embodiment, as shown in FIGS. 1 and 3, at least a part of the reflective layer 40 makes contact with the insulating layer 12, thereby improving the reflectance of the reflective layer 40.

In addition, according to the embodiment, in order to more improve the reflectance of the reflective layer 40, the contact area between the reflective layer 40 and the first and second electrodes 31 and 32 is reduced by changing the shape of the first and second electrodes 31 and 32 while increasing the contact area between the reflective layer 40 and the insulating layer 12.

For example, the first and second electrodes 31 and 32 may include electrode body parts 31a and 32a and extension parts 31b and 32b protruding the electrode body parts 31a and 32a. The widths of the extension parts 31b and 32b may be less than the widths of the electrode body parts 31a and 32a. Only the extension parts 31b and 32b may be provided in the cavity 15 of the body 10. In addition, wires 21 and 22, which are conductive connection members, are bonded to the extension parts 31b and 32b so that the first and second electrodes 31 and 32 can be electrically connected with the light emitting diode 20.

Accordingly, since the reflective layer 40 can directly make contact with the insulating layer 12 except for a region in which the extension parts 31b and 32b are provided, the reflectance of the reflective layer 40 can be improved.

Meanwhile, the first and second electrodes 31 and 32 may be designed in various shapes such that the area of a first region of the reflective layer 40 making contact with the first and second electrodes 31 and 32 is less than the area of a second region making contact with the insulating layer 12. However, the embodiment is not limited thereto. In addition, the reflective layer 40 may be designed such that the contact area between the reflective layer 40 and the insulating layer 12 corresponds to 5% to 100% of the area of the top surface of the body 10.

The light emitting diode 20 may be mounted over the body 10. If the body 10 includes the cavity 15, the light emitting diode 20 may be installed in the cavity 15.

At least one light emitting diode 20 may be mounted over the body 10 according to the design of the light emitting device 100. If a plurality of light emitting devices 100 are mounted over the body 10, a plurality of electrodes and a plurality of reflective layers may be formed to supply power to the light emitting devices 100, but the embodiment is not limited thereto.

The light emitting diode 20 may be directly mounted over the insulating layer 12 of the body 10 or may be mounted over a chip pad 33. The chip pad 33 may include at least one of Au, Cu, Ni, and Ti. For example, the chip pad 33 may include the same materials as those of the first and second electrodes 31 and 32.

Meanwhile, when the reflective layer 40 is formed over a region for the light emitting diode 20, the light emitting diode 20 may be formed over the reflective layer 40.

The light emitting diode 20 can be easily attached to one of the chip pad 33, the insulating layer 12 and the reflective layer 40 of the body 10 by using a solder material such as AuSn, PbSn, or In.

The light emitting diode 20 may include at least one color light emitting diode of red, green, white, and blue light emitting diodes to emit red, green, white, or blue light, or a UV light emitting diode, but the embodiment is not limited thereto. In addition, a plurality of the light emitting diodes 20 may be mounted over the body 10.

The light emitting diode 20 can be electrically connected to the first and second electrodes 31 and 32 by the wires 21 and 22. For example, ends of the wires 21 and 22 are bonded to the extension parts 31b and 32b of the first and second electrodes 31 and 32, and opposite ends of the wires 21 and 22 may be bonded to the light emitting diode 20, but the embodiment is not limited thereto.

In this case, the reflective layer 40 may not be formed in bonding parts of the wires 21 and 22 such that the first and second electrodes 31 and 32 can be easily bonded to the wires 21 and 22.

If the reflective layer 40 has superior electrical conductivity, and the first and second reflective layers 41 and 42 are electrically isolated from each other, the wires 21 and 22 may be bonded to the first and second reflective layers 41 and 42. In this case, power may be supplied from the first and second electrodes 31 and 32 to the light emitting diode 20 through the first and second reflective layers 41 and 42.

Meanwhile, if a plurality of electrodes of the light emitting device 100 are formed, the reflective layer 40 may include a plurality of reflective layers electrically isolated from each other, but the embodiment is not limited thereto.

The cavity 15 may be filled with the encapsulant 50. In other words, the encapsulant 50 can seal the light emitting diode 20.

The encapsulant 50 may include a silicon material, a resin material, or a phosphor.

The lens 60 may be formed over the body 10.

Although the lens 60 has a dome shape in FIG. 2, the lens 60 may have various shapes according to the design of the light emitting device 100. Accordingly, the lens 60 may variously adjust the discharge of light emitted from the light emitting diode 20.

Hereinafter, the method of manufacturing the light emitting device 100 according to the first embodiment will be described in detail. However, repeated description will be omitted in order to avoid redundancy.

FIGS. 4 to 10 are views showing the method of manufacturing the light emitting device 100 according to the first embodiment.

Figure 4:
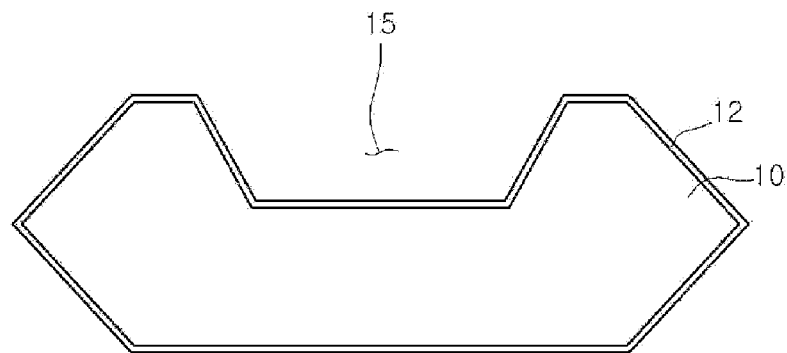
FIGS. 4 to 10 are sectional views showing a method of manufacturing the light emitting device according to the first embodiment.

Referring to FIG. 4, the insulating layer 12 is formed over the surface of the body 10. In this case, the body 10 may be provided therein with the cavity 15.

For example, the body 10 may be formed through injection-molding or may be formed by stacking a plurality of layers. The cavity 15 may be formed in the injection-molding of the body 10 or formed through an additional etching process.

Figure 5:
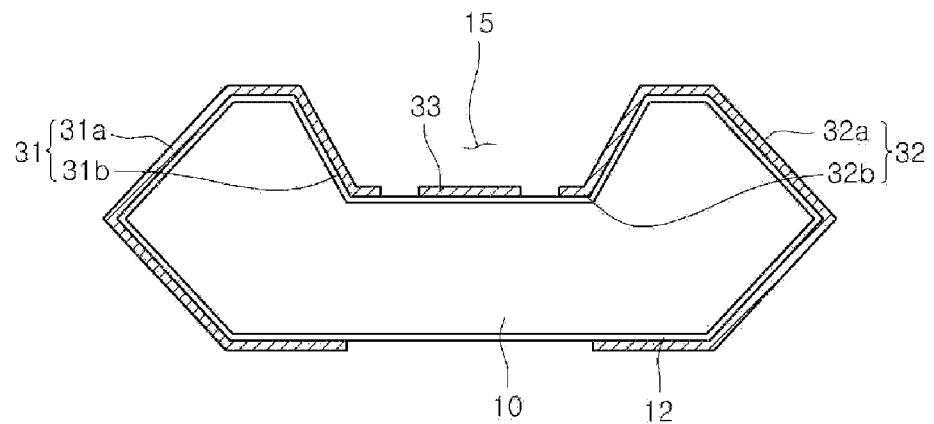
Figure 6:
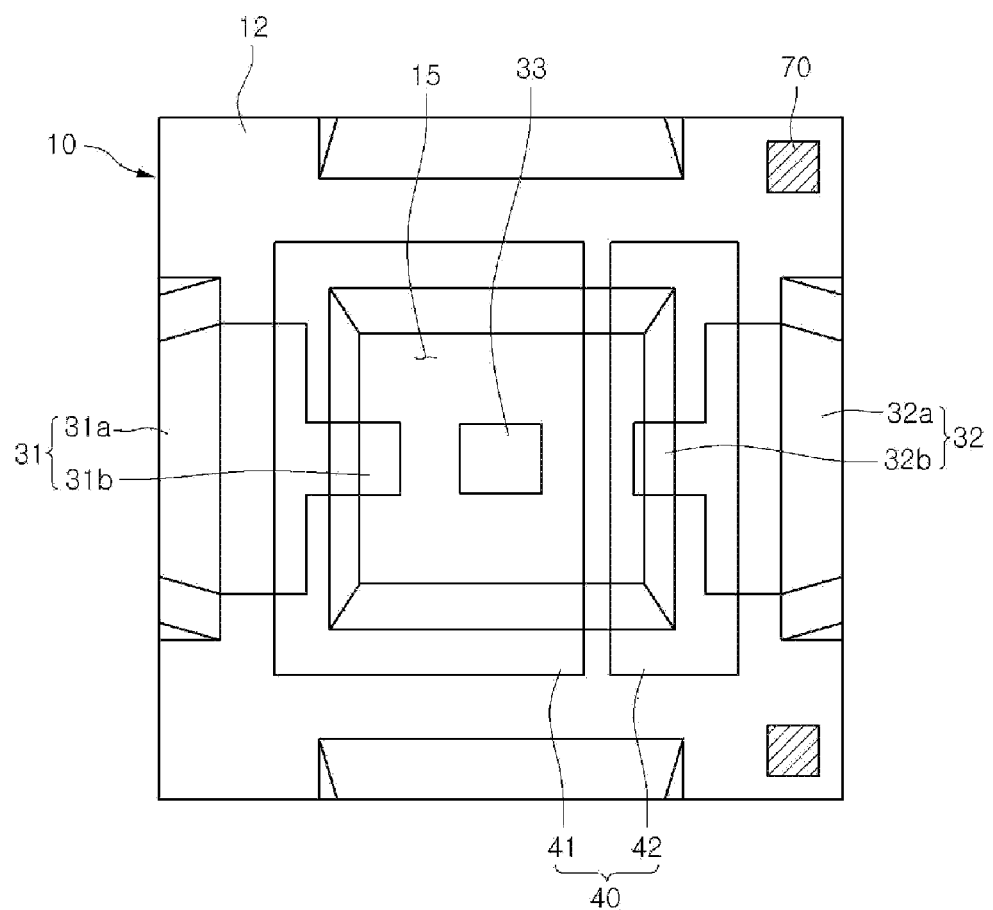

Referring to FIGS. 5 and 6, the first and second electrodes 31 and 32 may be formed over the insulating layer 12 of the body 10. The first electrode 31 and the second electrode 32 electrically act as a cathode and an anode to supply power to the light emitting diode 20.

The first and second electrodes 31 and 32 may have a multi-layer structure. For example, the first and second electrodes 31 and 32 may include a Ti/Cu/Ni/Au layer in which Ti, Cu, Ni, and Au are sequentially stacked.

The first and second electrodes 31 and 32 may be selectively formed through a plating scheme, a deposition scheme, or a photolithography scheme, but the embodiment is not limited thereto.

The first and second electrodes 31 and 32 may include the electrode body parts 31a and 32a and the extension parts 31b and 32b protruding from the electrode body parts 31a and 32a. For example, as shown in FIG. 6, the extension parts 31b and 32b may be provided in the cavity 15 of the body 10, and the electrode body parts 31a and 32a may be provided outside the cavity 15. However, the first and second electrodes 31 and 32 may have various shapes.

The wires 21 and 22 are bonded to the extension parts 31b and 32b in the following process, so that the first and second electrodes 31 and 32 can be electrically connected to the light emitting diode 20.

The chip pad 33 may be formed over a region of the insulating layer 12 of the body 10 attached to the light emitting diode 20. The chip pad 33 may include at least one selected from the group consisting of Au, Cu, Ni, and Ti. For example, the chip pad 33 may include the same materials as those of the first and second electrodes 31 and 32.

Figure 7:
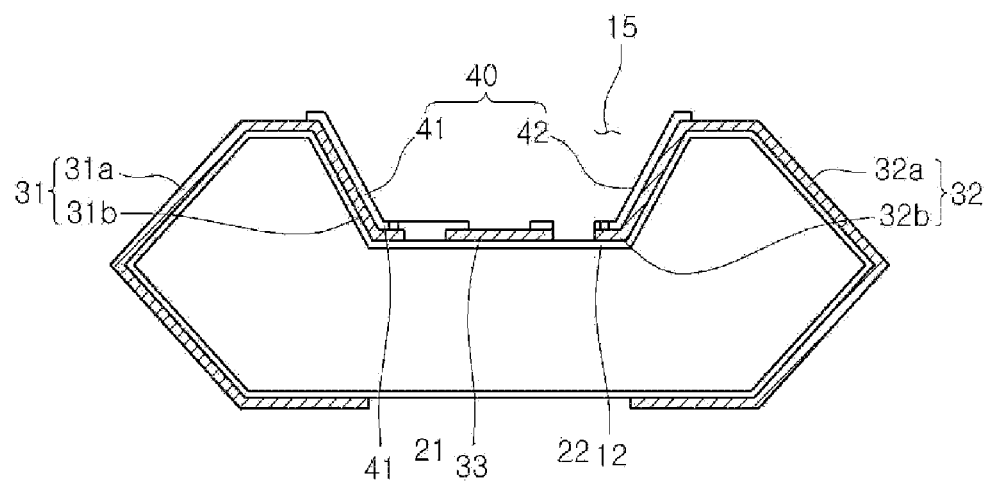
Figure 9:
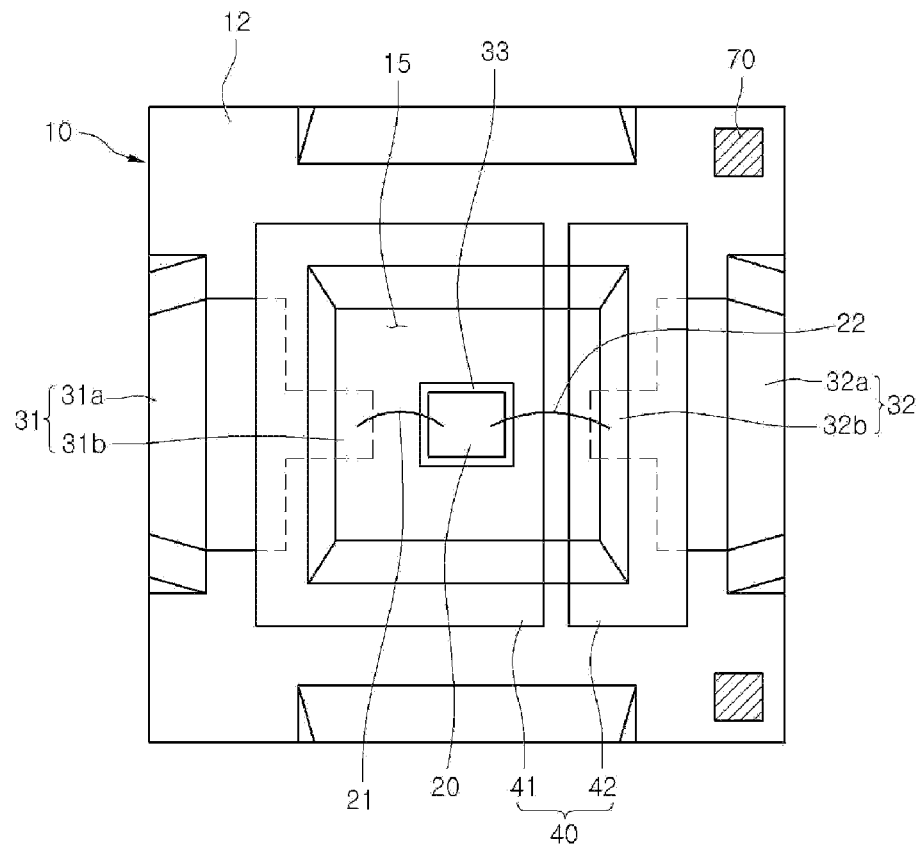

Referring to FIGS. 7 and 9, the reflective layer 40 may be formed over the insulating layer 12, the first electrode 31, and the second electrode 32 over the body 10. The reflective layer 40 may be formed at a position in which light emitted from the light emitting diode 20 can be effectively reflected, for example, at an inside of the cavity 15 of the body 10, but the embodiment is not limited thereto.

The reflective layer 40 may be formed through at least one of a deposition scheme, a plating scheme, and a photolithography scheme, but the embodiment is not limited thereto.

When the first and second electrodes 31 and 32 make contact with the lower portion of the reflective layer 40, the reflective layer 40 may represent a lower reflectance as compared with when the insulating layer 12 makes contact with the lower portion of the reflective layer 40.

Therefore, according to the embodiment, at least a part of the reflective layer 40 makes contact with the insulating layer 12, so that the reflectance of the reflective layer 40 can be improved.

If the reflective layer 40 has electrical conductivity, the reflective layer 40 is electrically divided into the first reflective layer 41 and the second reflective layer 42 such that the first and second electrodes 31 and 32 are not shorted with each other.

In addition, the reflective layer 40 may be not formed in the region for the attachment of the light emitting diode 20 or the region for the bonding of the wires 21 and 22, but the embodiment is not limited thereto.

The reflective layer 40 may have a multi-layer structure. For example, the reflective layer 40 may include a Ti/Ag layer in which Ti and Ag are sequentially formed.

Figure 8:
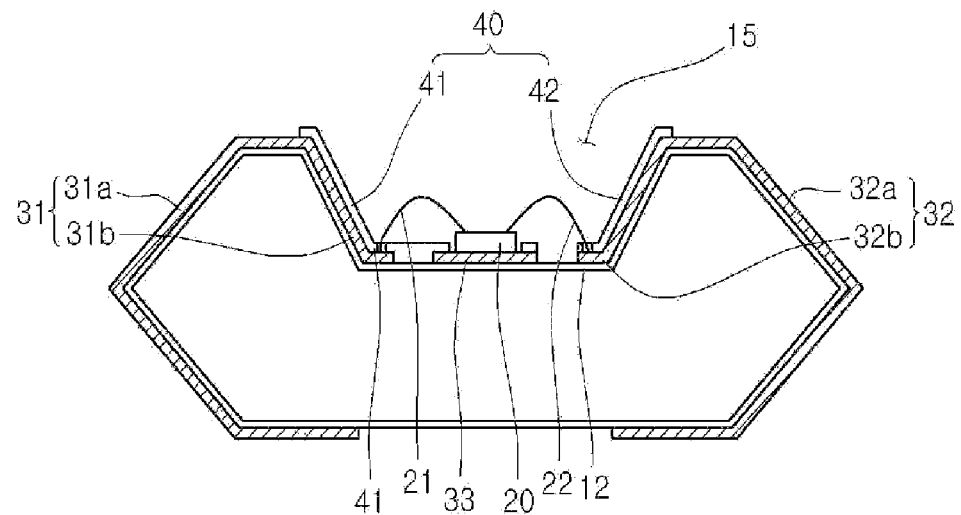

Referring to FIGS. 8 and 9, the light emitting diode 20 may be mounted over the body 10. In addition, the light emitting diode 20 may be electrically connected to the first and second electrodes 31 and 32 by the wires 21 and 22.

The light emitting diode 20 may be directly mounted over the insulating layer 12 of the body 10. In addition, the light emitting diode 20 may be mounted over the reflective layer 40 or the chip pad 33. In this case, the light emitting diode 20 can be easily attached to one of the chip pad 33, and the insulating layer 12 and the reflective layer 40 of the body 10 by using a solder material such as AuSn, PbSn, or In.

The wires 21 and 22 may be directly bonded to the first and second electrodes 31 and 32, or may be bonded to the first and second reflective layers 41 and 42, but the embodiment is not limited thereto.

Figure 10:
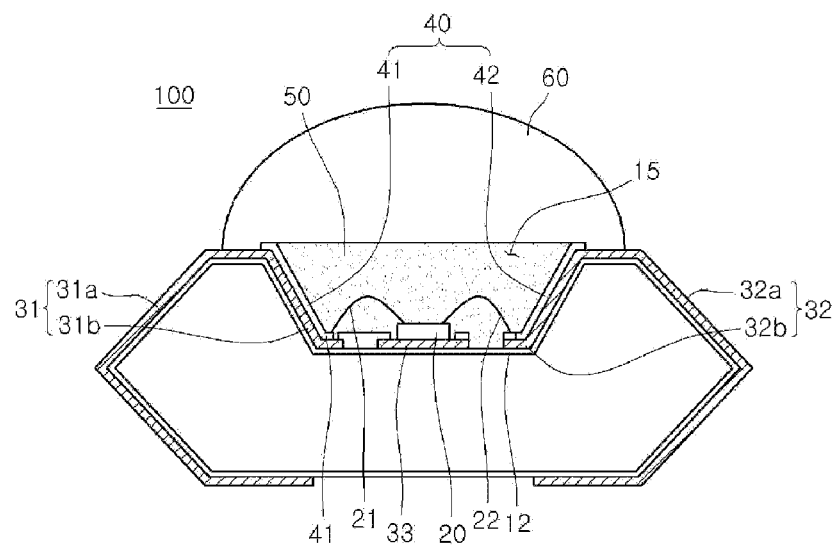

Referring to FIGS. 8 and 10, the cavity 15 of the body 10 is filled with the encapsulant 50 to seal the light emitting diode 20, and the lens 60 is formed over the body 10 and the encapsulant 50, thereby providing the light emitting device 100.

Embodiment 2

Hereinafter, a light emitting device 100B according to a second embodiment will be described while focusing over components of the light emitting device 100B, and other structures the same as those of the first embodiment will not further described in order to avoid redundancy.

The light emitting device 100B according to the second embodiment is identical to the light emitting device 100 according to the first embodiment except for the structures of the first and second electrodes.

Figure 11:
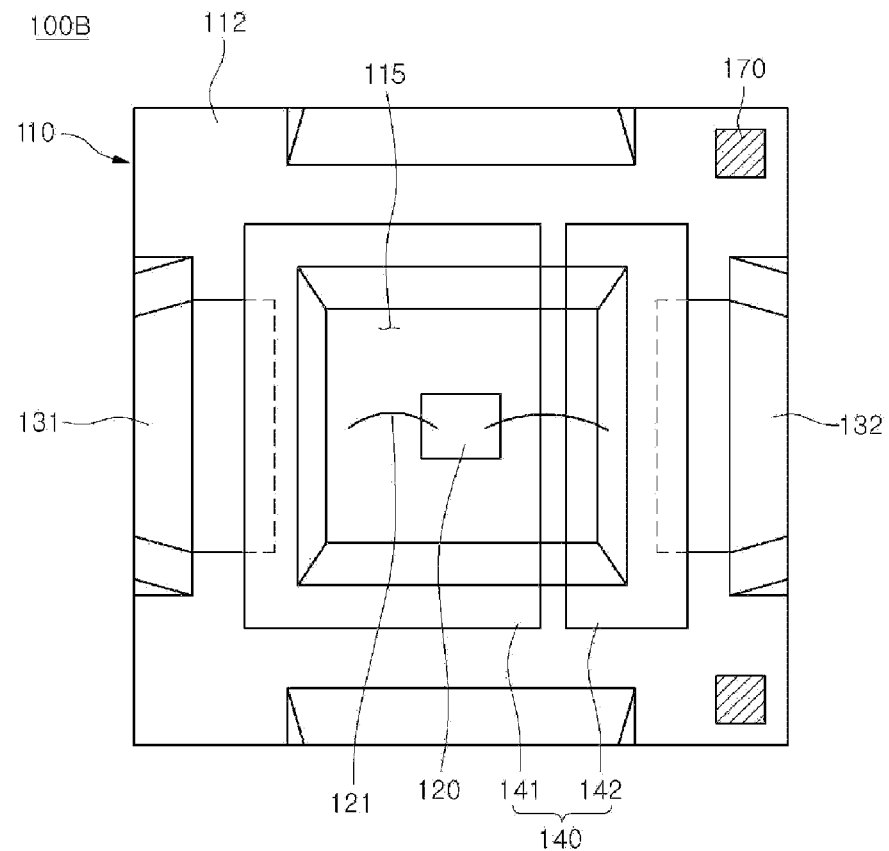
FIG. 11 is a top view showing a light emitting device according to a second embodiment.

FIG. 11 is a top view showing the light emitting device 100B according to the second embodiment.

Referring to FIG. 11, the light emitting device 100B includes a body 110 having a cavity 115, an insulating layer 112 including $Si_xO_y$ over the surface of the body 110, a light emitting diode 120 provided over the body 110, first and second electrodes 131 and 132 provided outside the cavity 115 and electrically connected to the light emitting diode 120, and a reflective layer 140 including first and second reflective layers 141 and 142 formed outside and inside the cavity 115, electrically connect the first and second electrodes 131 and 132 to the light emitting diode 120, and reflect light emitted from the light emitting diode 120.

Differently from the light emitting device 100 according to the first embodiment, the extension parts of the first and second electrodes 131 and 132 are not formed in the cavity 115.

In other words, the first and second electrodes 131 and 132 are provided outside the cavity 115 of the body 110, and power can be supplied to the light emitting diode 120 through the first and second reflective layers 141 and 142.

The first and second reflective layers 141 and 142 provided inside the cavity 115 makes contact with the insulating layer 112 to represent a high reflectance. In particular, since the first and second electrodes 131 and 132 are not provided in the cavity 115, the contact areas between the first and second reflective layers 141 and 142 and the insulating layer 112 is increased, so that the light emission efficiency of the light emitting device 100B can be improved.

Embodiment 3

Hereinafter, a light emitting device 100C according to a third embodiment will be described while focusing on components of the light emitting device 100C, and other structures the same as those of the first embodiment will not further described in order to avoid redundancy.

The light emitting device 100C according to the third embodiment is identical to the light emitting device 100 according to the first embodiment except for the shape of a body and the existence state of a cavity.

Figure 12:
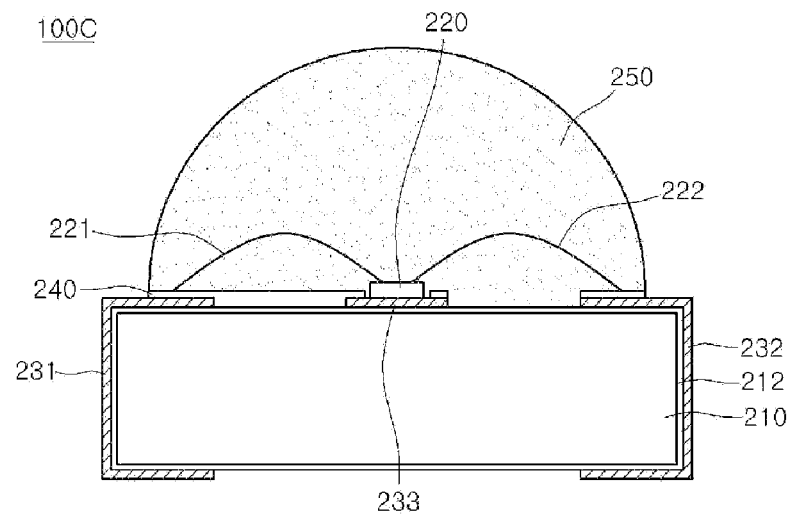
FIG. 12 is a sectional view showing a light emitting device according to a third embodiment.

FIG. 12 is a sectional view showing the light emitting device 100C according to the third embodiment.

Referring to FIG. 12, the light emitting device 100C includes a body 210, an insulating layer 212 including $Si_xO_y$ over the surface of the body 210, a light emitting diode 220 provided over the body 210, first and second electrodes 231 and 232 provided over the body 210 and electrically connected to the light emitting diode 220, and a reflective layer 240 to reflect light emitted from the light emitting diode 220, in which at least a part of the reflective layer 240 makes contact with the top surface of the insulating layer 212.

The light emitting device 100C further includes an encapsulant 250 to seal the light emitting diode 220 and a lens 260 over the encapsulant 250.

The body 210 does not include a cavity, but may have a flat top surface.

The reflective layer 240 may be formed at a position in which light emitted from the light emitting diode 220 can be effectively reflected. For example, the reflective layer 240 may be formed over the top surface of the body 210 including an outer peripheral portion of the light emitting diode 220.

When the insulating layer 212 makes contact with the lower portion of the reflective layer 240, the reflective layer 240 can represent a high reflectance as compared with when the first and second electrodes 231 and 232 makes contact with the lower portion of the reflective layer 240.

Therefore, preferably, the first and second electrodes 231 and 232 are formed in such a manner that the contact area between the reflective layer 240 and the insulating layer 212 is increased. However, the first and second electrodes 231 and 232 may have various structures.

Embodiment 4

Hereinafter, a light emitting device 100D according to a fourth embodiment will be described while focusing on components of the light emitting device 100D, and other structures the same as those of the first embodiment will not further described in order to avoid redundancy.

The structure of the light emitting device 100D according to the fourth embodiment is identical to the structure of the light emitting device 100 according to the first embodiment except for the structures of electrodes and the type of the light emitting diode 100D.

Figure 13:
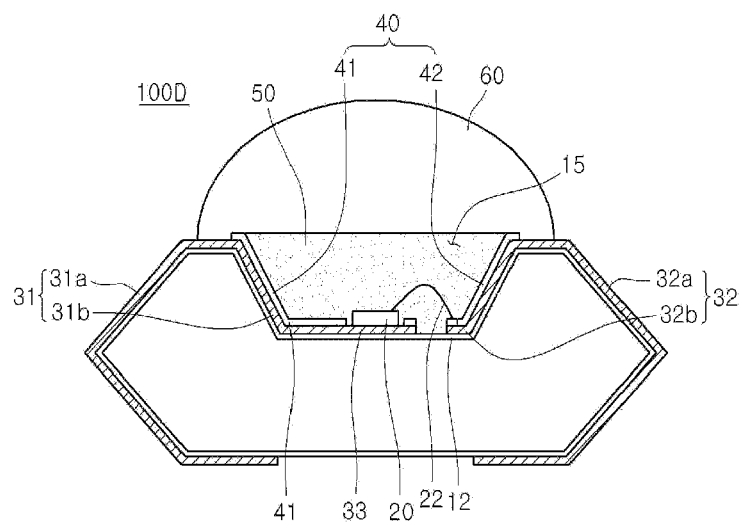
FIG. 13 is a sectional view showing a light emitting device according to a fourth embodiment.

FIG. 13 is a sectional view showing the light emitting device 100D according to the fourth embodiment.

Referring to FIG. 13, the light emitting device 100D includes a body 10 having a cavity 15, an insulating layer 12 including $Si_xO_y$ over the surface of the body 10, first and second electrodes 31 and 32 provided over the body 10, a light emitting diode 20 over the first electrode 31, a reflective layer 140 including first and second reflective layers 141 and 142 formed over the insulating layer 12 and the first and second electrodes 31 and 32 to reflect light emitted from the light emitting diode 20.

The light emitting diode 20 may include a vertical-type light emitting device in which a plurality of electrodes are vertically arranged. For example, as shown in FIG. 13, one wire 22 is electrically connected to the second electrode 32, and a bottom surface of the light emitting diode 20 may be electrically connected to the first electrode 31.

Embodiment 5

Hereinafter, a light emitting device 100E according to a fifth embodiment will be described while focusing on components of the light emitting device 100E, and other structures the same as those of the first embodiment will not further described in order to avoid redundancy.

The structure of the light emitting device 100E according to the fifth embodiment is identical to the structure of the light emitting device 100 according to the first embodiment except for the structures of electrodes.

Figure 14:
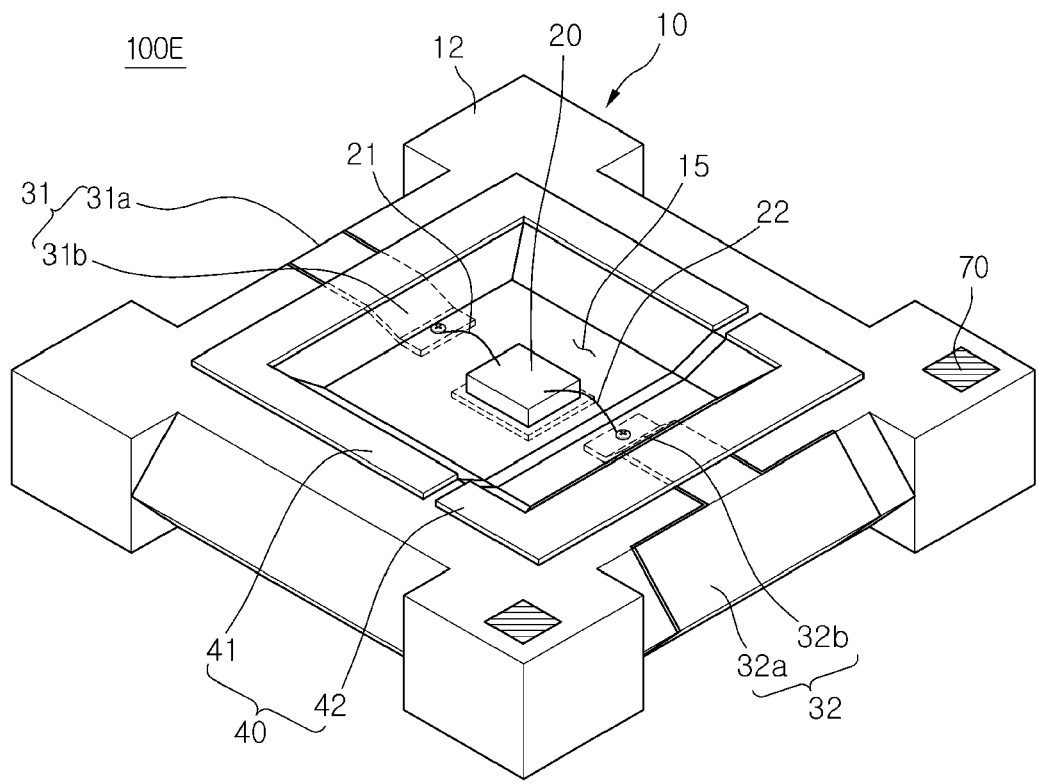
FIG. 14 is a perspective view showing a light emitting device according to a fifth embodiment.

FIG. 14 is a perspective view showing the light emitting device 100E according to the fifth embodiment.

Referring to FIG. 14, the light emitting device 100E includes a body 10 having a cavity 15, an insulating layer 12 formed over the surface of the body 10 and including silicon oxide ($Si_xO_y$), first and second electrodes 31 and 32 provided over the body 10, a light emitting diode 20 over a bottom surface of the cavity 15, and a reflective layer 40 including first and second reflective layers 41 and 42 formed over the insulating layer 12 and the first and second electrodes 31 and 32 to reflect light emitted from the light emitting diode 20.

The first and second electrodes 31 and 32 may include electrode body parts 31a and 32a and extension parts 31b and 32b protruding from the electrode body parts 31a and 32a. The widths of the extension parts 31b and 32b may be less than the widths of the electrode body parts 31a and 32a. The extension parts 31b and 32b are positioned over the top surface of the body 10, and the electrode body parts 31a and 32a may be provided over the lateral surface and the bottom surface of the body 10.

Differently, the electrode body parts 31a and 32a are formed only over the bottom surface of the body 10, and the extension parts 31b and 32b may extend from the lateral surface of the body 10 to the inside of the cavity 15 through the top surface of the body 10.

Wires 21 and 22 are bonded to the extensions 31b and 32b to electrically connect the first and second electrodes 31 and 32 to the light emitting diode 20.

Therefore, since the reflective layer 40 may make directly contact with the insulating layer 12 except for the region in which the extension parts 31b and 32b are provided, the reflectance of the reflective layer 40 can be improved even over the top surface of the body 10.

Embodiment 6

Hereinafter, a light emitting device 100F according to a sixth embodiment will be described while focusing on components of the light emitting device 100E, and other structures the same as those of the first embodiment will not further described in order to avoid redundancy.

In the light emitting device 100F according to the sixth embodiment, the light emitting diode 20 is bonded through a conductive solder which is another example of a conductive coupling member.

Figure 15:
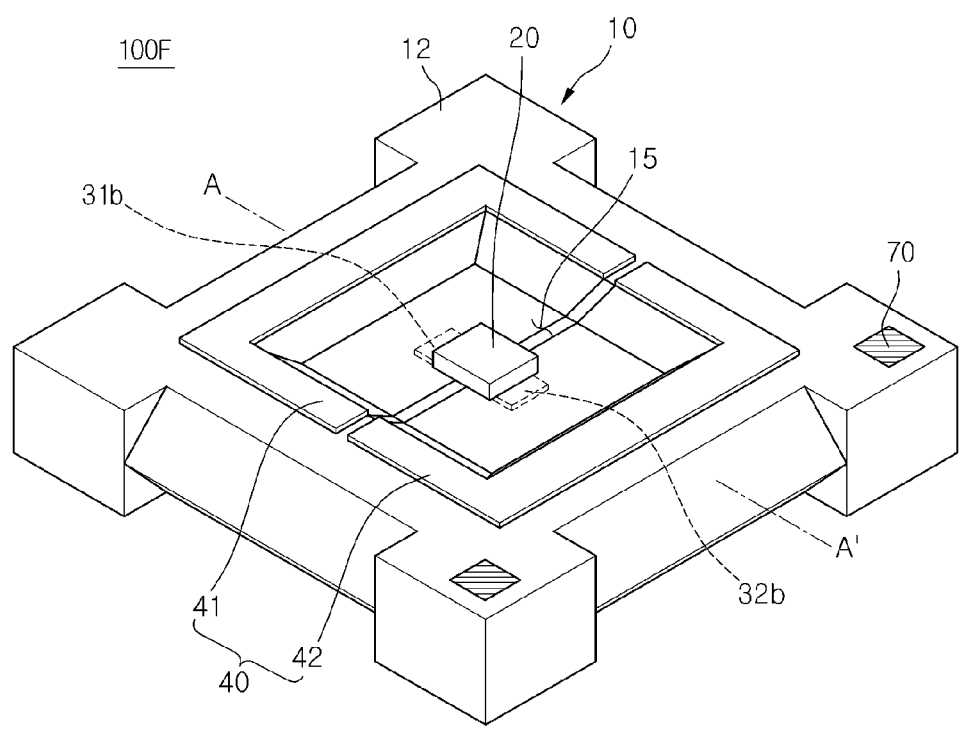
FIG. 15 is a perspective view showing a light emitting device according to a sixth embodiment.
Figure 16:
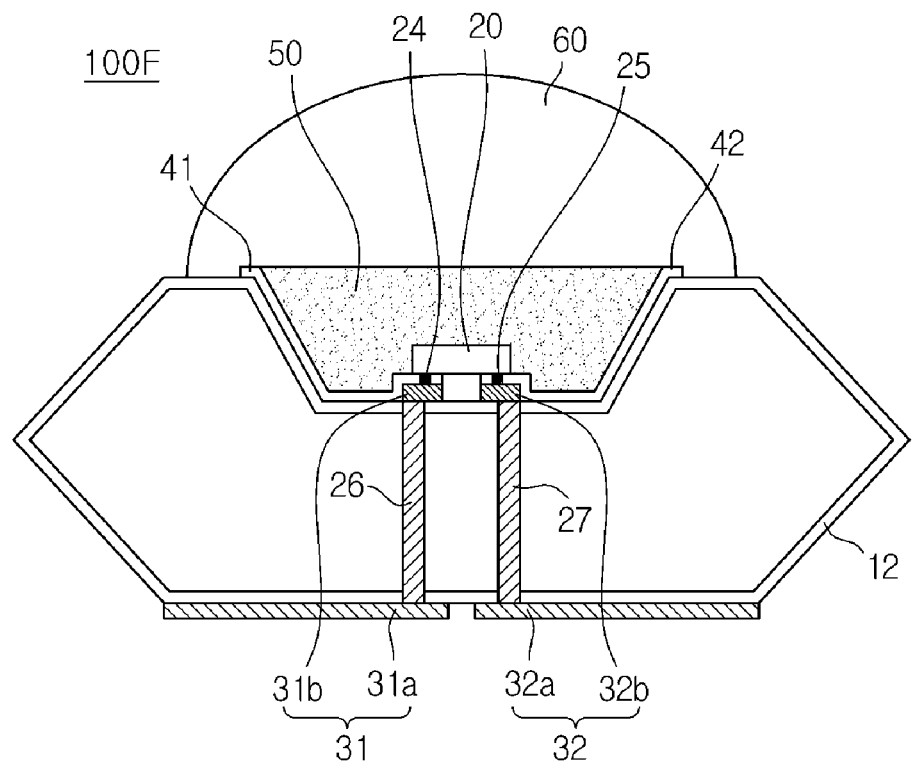
FIG. 16 is a sectional view showing the light emitting device of FIG. 15.

FIG. 15 is a perspective view showing the light emitting device 100F according to the sixth embodiment, and FIG. 16 is a sectional view showing the light emitting device 100F of FIG. 15.

Referring to FIGS. 15 and 16, the light emitting device 100F includes a body 10 having a cavity 15, an insulating layer 12 formed over the surface of the body 10 and including silicon oxide ($Si_xO_y$), first and second electrodes 31 and 32 provided over top and rear surfaces of the body 10, a light emitting diode 20 over a bottom surface of the cavity 15, and a reflective layer 40 including the first and second reflective layers 41 and 42 formed over the insulating layer 12 and the first and second electrodes 31 and 32 to reflect light emitted from the light emitting diode 20.

The first and second electrodes 31 and 32 include the first and second electrode body parts 31a and 32a spaced apart from each other over the rear surface of the body 10 and first and second electrode terminals 31b and 32b spaced apart from each other the top surface of the cavity 15 of the body 10. The widths of the electrode terminals 31ba and 32b may be narrower than the first and second electrode body parts 31a and 32a. The first and second electrode terminals 31b and 32b may protrude out of the light emitting diode 20 at the bottom surface of the cavity 15.

The first and second electrode terminals 31b and 32b are provided therein with conductive vias 26 and 27 to be connected with the first and second electrode body parts 31a and 32a formed over the rear surface of the body 10.

The conductive vias 26 and 27 pass through the insulating layer 12 and the body 10 to connect the electrode terminals 31b and 32b, which is provided at the upper portion of the body 10, with the electrode body parts 31a and 32a, which is provided at the lower portion of the body 10. The conductive vias 26 and 27 may have the form of a via hole, or may have the form of a via filled with a conductive material.

The reflective layer 40 covers upper portions of the electrode terminals 31b and 32b. In other words, the first and second reflective layers 41 and 42 are separated from each other in a region in which the electrode terminals 31b and 32b are separated from each other, so that the first electrode 31 is electrically insulated from the second electrode 32.

Meanwhile, the reflective layer 40 includes an opening to expose the electrode terminals 31b and 32b, and conductive solders 24 and 25 are formed in the opening so that the light emitting diode 20 is electrically conducted with the first and second electrode terminals 31b and 32b.

The light emitting diode 20 is subject to flip chip boding by conductive solders 24 and 25 prepared in the opening.

As described above, the electrodes 31 and 32 include the electrode terminals 31b and 32b formed over the bottom surface of the cavity 15, the electrode body parts 31a and 32a formed over the rear surface of the body 10, and the conductive vias 26 and 27 connecting the electrode terminals 31b and 32b with the electrode body parts 31a and 32a, thereby minimizing the area of the electrode terminals 31b and 32b in the cavity 15. Accordingly, the contact area between the reflective layer 40 and the insulating layer 12 can be maximized. In addition, the conductive vias 26 and 27 are formed to improve a heat dissipation property.

In addition, the first and second electrodes 31 and 32 may include electrode body parts and extension parts surrounding the body 10 as shown in FIG. 1 and may be subject to flip chip bonding.

The light emitting device according to the embodiment may serve as a lighting system such as a backlight unit, an indicator, a lamp or a streetlamp.

Hereinafter, examples of the present invention will be described with reference to FIGS. 17 and 18.

Figure 17:
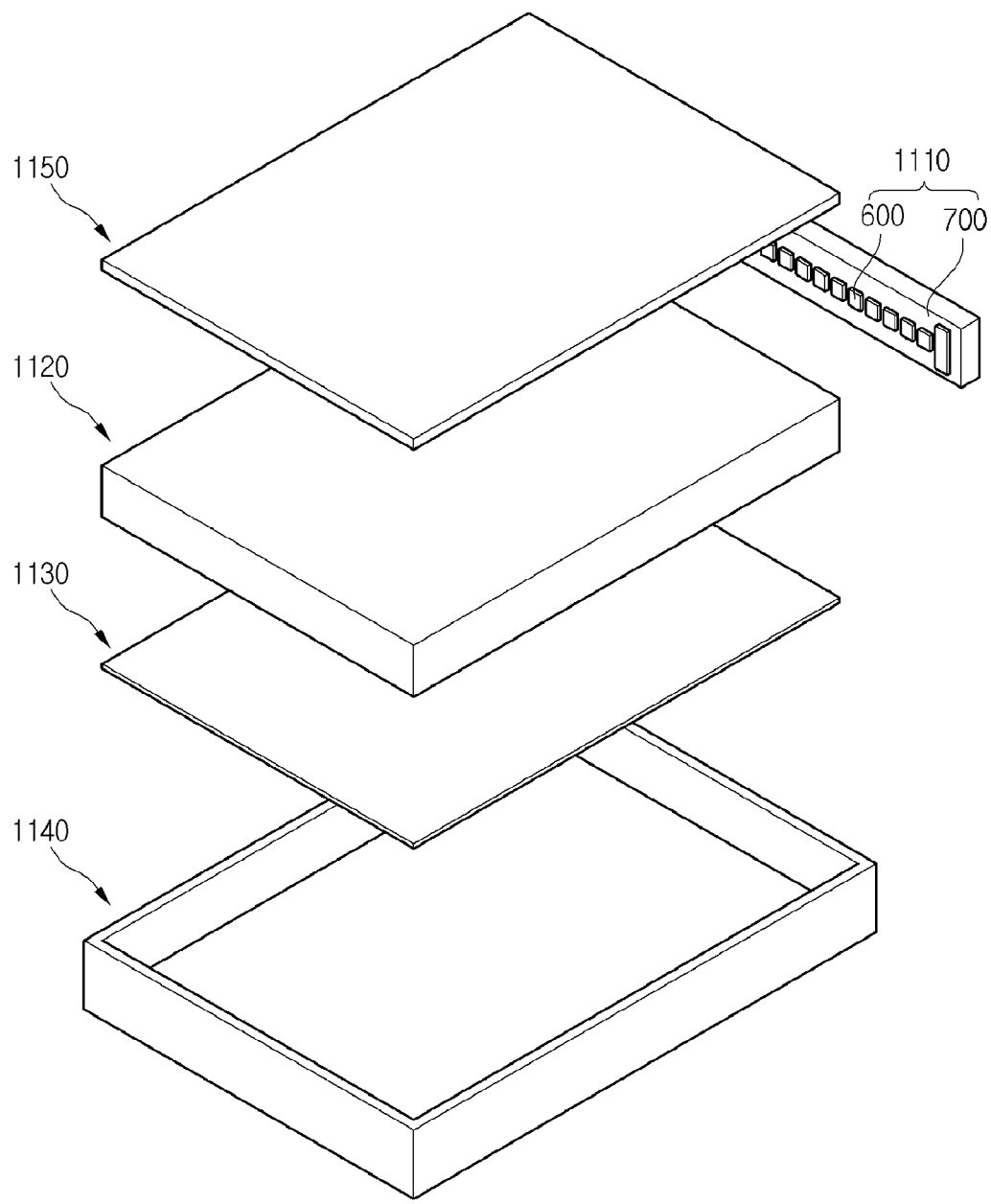
FIG. 17 is a perspective view showing a backlight unit including the light emitting device according to the embodiment.

FIG. 17 is a perspective view showing a backlight unit 1100 including the light emitting device according to the present invention.

The backlight unit 1100 shown in FIG. 11 is an example of a lighting system and the embodiment is not limited thereto.

Referring to FIG. 17, the backlight unit 1100 includes a bottom cover 1140, a light guide member 1120, and a light emitting module 1110 installed at one side or over the bottom surface of the light guide member 1120. In addition, a reflective sheet 1130 is disposed under the light guide member 1120.

The bottom cover 1140 has a box shape having an open top surface being open to receive the light guide member 1120, the light emitting module 1110 and the reflective sheet 1130 therein. In addition, the bottom cover 1140 may include metallic material or resin material, but the embodiment is not limited thereto.

The light emitting module 1110 may include a plurality of light emitting devices 600 installed over a substrate 700. The light emitting devices 600 provide the light to the light guide member 1120.

As shown in FIG. 17, the light emitting module 1110 is installed over at least one inner side of the bottom cover 1140 to provide the light to at least one side of the light guide member 1120.

In addition, the light emitting module 1110 can be provided under the light guide member 1120 in the bottom cover 1140 to provide the light toward the bottom surface of the light guide member 1120. Such an arrangement can be variously changed according to the design of the backlight unit 1100.

The light guide member 1120 is installed in the bottom cover 1140. The light guide member 1120 converts the light emitted from the light emitting module 1110 into the surface light to guide the surface light toward a display panel (not shown).

The light guide member 1120 may include a light guide plate. For instance, the light guide plate can be manufactured by using acryl-based resin, such as PMMA (polymethyl methacrylate), PET (polyethylene terephthalate), COC, PC (polycarbonate) or PEN (polyethylene naphthalate) resin.

An optical sheet 1150 may be provided over the light guide member 1120.

The optical sheet 1150 may include at least one of a diffusion sheet, a light collection sheet, a brightness enhancement sheet, and a fluorescent sheet. For instance, the optical sheet 1150 has a stack structure of the diffusion sheet, the light collection sheet, the brightness enhancement sheet, and the fluorescent sheet. In this case, the diffusion sheet uniformly diffuses the light emitted from the light emitting module 1110 such that the diffused light can be collected over the display panel (not shown) by the light collection sheet. The light output from the light collection sheet is randomly polarized and the brightness enhancement sheet increases the degree of polarization of the light output from the light collection sheet. The light collection sheet may include a horizontal and/or vertical prism sheet. In addition, the brightness enhancement sheet may include a dual brightness enhancement film and the fluorescent sheet may include a transmittive plate or a transmittive film including phosphors.

The reflective sheet 1130 can be disposed under the light guide member 1120. The reflective sheet 1130 reflects the light, which is emitted through the bottom surface of the light guide member 1120, toward the light exit surface of the light guide member 1120. The reflective sheet 1130 may include resin material having a high reflectance, such as PET, PC or PVC resin, but the embodiment is not limited thereto.

Figure 18:
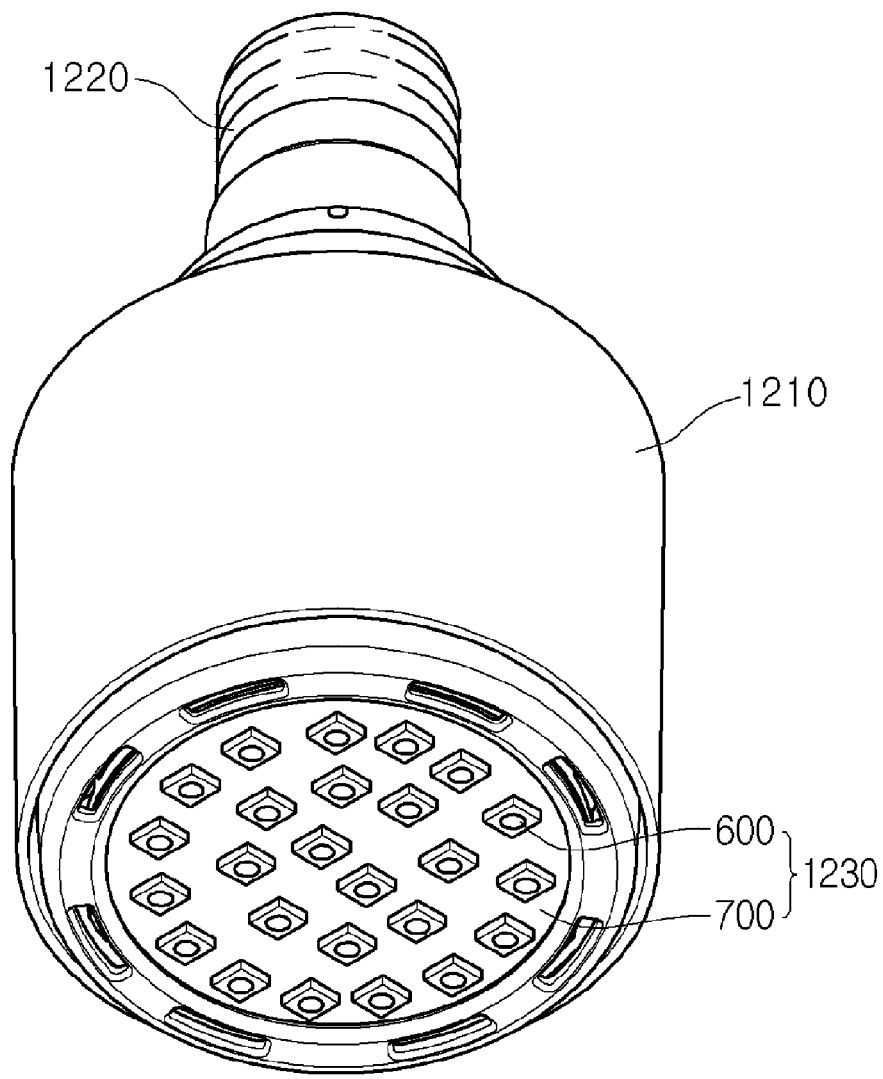
FIG. 18 is a perspective view showing a lighting system including the light emitting device according to the embodiment.

FIG. 18 is a perspective view showing a lighting system 1200 including the light emitting device according to the embodiment. The lighting system 1200 shown in FIG. 18 is only one example and the embodiment is not limited thereto.

Referring to FIG. 18, the lighting system 1200 includes a case body 1210, a light emitting module 1230 installed in the case body 1210, and a connection terminal 1220 installed in the case body 1210 to receive power from an external power source.

Preferably, the case body 1210 includes material having superior heat dissipation property. For instance, the case body 1210 includes metallic material or resin material.

The light emitting module 1230 may include a substrate 700 and at least one light emitting device 600 installed over the substrate 700.

The substrate 700 includes an insulating member printed with a circuit pattern. For instance, the substrate 700 includes a PCB (printed circuit board), an MC (metal core) PCB, an F (flexible) PCB, or a ceramic PCB.

In addition, the substrate 700 may include material that effectively reflects the light. The surface of the substrate 300 can be coated with a color, such as a white color or a silver color, to effectively reflect the light.

At least one light emitting device 600 can be installed over the substrate 700.

Each light emitting device 600 may include at least one LED (light emitting diode). The LED may include a colored LED that emits the light having the color of red, green, blue or white and a UV (ultraviolet) LED that emits UV light.

The light emitting module 1230 can be variously arranged to provide various colors and brightness. For instance, the white LED, the red LED and the green LED can be arranged to achieve the high color rendering index (CRI). In addition, a fluorescent sheet can be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may include yellow phosphors. In this case, the light emitted from the light emitting module 1230 passes through the fluorescent sheet so that the light is viewed as white light.

The connection terminal 1220 is electrically connected to the light emitting module 1230 to supply power to the light emitting module 1230. Referring to FIG. 14, the connection terminal 1220 has a shape of a socket screw-coupled with the external power source, but the embodiment is not limited thereto. For instance, the connection terminal 1220 can be prepared in the form of a pin inserted into the external power source or connected to the external power source through a wire.

According to the lighting system as described above, at least one of the light guide member, the diffusion sheet, the light collection sheet, the brightness enhancement sheet and the fluorescent sheet is provided in the path of the light emitted from the light emitting module, so that the desired optical effect can be achieved.

The backlight unit 1100 and the lighting system 1200 of FIGS. 17 and 18 include the light emitting modules 1110 and 1230 including the light emitting device of FIGS. 1 to 16, so that superior light efficiency can be acquired.

The embodiment can provide a light emitting device having a novel structure and a method of manufacturing the same.

The embodiment can provide a light emitting device capable of improving light emission efficiency.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a body;
an insulating layer over a surface of the body;
at least one electrode over the insulating layer;
a light emitting diode connected to the electrode; and
a reflective layer over the insulating layer,
wherein the reflective layer includes a first region over electrodes and a second region over the insulating layer.

2. The light emitting device of claim 1, wherein the insulating layer includes $Si_xO_y$.

3. The light emitting device of claim 1, wherein the reflective layer represents a higher reflectance when the reflective layer is formed over the insulating layer than when the reflective layer is formed over the electrode.

4. The light emitting device of claim 1, wherein the reflective layer has a stack structure of Ti and Ag.

5. The light emitting device of claim 4, wherein an uppermost layer of the electrode includes Au.

6. The light emitting device of claim 5, wherein the electrode has a stack structure of Ti, Cu, Ni, and Au.

7. The light emitting device of claim 1, wherein the body is provided therein with a cavity.

8. The light emitting device of claim 7, wherein the electrode includes an electrode body part and an extension part provided in the cavity while projecting from the electrode body part, and the reflective layer is formed over the extension part and the insulating layer.

9. The light emitting device of claim 7, wherein the electrode is formed outside the cavity, and the reflective layer is formed outside and inside the cavity, to electrically connect the electrode to the light emitting diode.

10. The light emitting device of claim 8, wherein the light emitting diode is electrically connected to the extension part through a conductive connection member.

11. The light emitting diode of claim 9, wherein the light emitting diode is electrically connected to the reflective layer through a conductive connection member.

12. The light emitting device of claim 1, wherein the reflective layer includes a plurality of reflective layers separated from each other.

13. The light emitting device of claim 1, wherein the second region of the reflective layer is greater than the first region of the reflective layer.

14. The light emitting device of claim 1, wherein a contact area between the reflective layer and the insulating layer corresponds to 5% to 100% based on an area of a top surface of the body.

15. A lighting system comprising:
a substrate; and
a light emitting module including a light emitting device provided over the substrate,
wherein the light emitting device includes an insulating layer over a surface of a body, at least one electrode over the insulating layer, a light emitting diode connected to the electrode, and a reflective layer over the insulating layer, and
wherein the reflective layer includes a first region over a plurality of electrodes and a second region over the insulating layer.

16. The lighting system of claim 15, wherein the reflective layer is formed over the insulating layer and the electrode, and at least a part of the reflective layer makes contact with a top surface of the insulating layer.

17. The lighting system of claim 15, wherein the reflective layer has a stack structure of Ti and Ag, and an uppermost layer of the electrode includes Au.

18. The lighting system of claim 16, wherein the second region is larger than the first region.

19. The lighting system of claim 15, wherein a contact area between the reflective layer and the insulating layer corresponds to 5% to 100% based on an area of a top surface of the body.

* * * * *